(12) United States Patent
Jin et al.

(10) Patent No.: US 11,081,053 B2
(45) Date of Patent: Aug. 3, 2021

(54) ELECTRONIC DEVICES HAVING DISPLAYS WITH COMPENSATION FOR OXIDE TRANSISTOR THRESHOLD VOLTAGE

(71) Applicant: Apple Inc., Cupertino, CA (US)

(72) Inventors: Jiayi Jin, Saratoga, CA (US); David A. Doyle, San Francisco, CA (US); Kyung Hoae Koo, San Jose, CA (US); Maofeng Yang, San Jose, CA (US); Michael H. Lim, Cupertino, CA (US); Paolo Sacchetto, Cupertino, CA (US); Timothy M. Johnson, San Jose, CA (US); Venkatesh Rajendran, San Jose, CA (US); Weijun Yao, Saratoga, CA (US); Yue Jack Chu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/283,481

(22) Filed: Feb. 22, 2019

(65) Prior Publication Data
US 2020/0243012 A1   Jul. 30, 2020

(30) Foreign Application Priority Data
Jan. 28, 2019   (CN) .......................... 201910079924.8

(51) Int. Cl.
*G09G 3/3258* (2016.01)
*G09G 3/3266* (2016.01)
*H01L 29/786* (2006.01)

(52) U.S. Cl.
CPC ......... *G09G 3/3258* (2013.01); *G09G 3/3266* (2013.01); *G09G 2300/0819* (2013.01);
(Continued)

(58) Field of Classification Search
CPC combination set(s) only.
See application file for complete search history.

(56) References Cited

U.S. PATENT DOCUMENTS 5,583,528 A * 12/1996 Ebihara ................... G09G 3/20
345/212
7,592,981 B2   9/2009 Maeda
(Continued)

FOREIGN PATENT DOCUMENTS

CN   101324715 A   12/2008
CN   104036740 A   9/2014
(Continued)

*Primary Examiner* — William Boddie
*Assistant Examiner* — Alecia D English
(74) *Attorney, Agent, or Firm* — Treyz Law Group, P.C.; Joseph F. Guihan

(57) ABSTRACT

A display may have an array of organic light-emitting diode display pixels. Each display pixel may include a drive transistor coupled in series with one or more emission transistors and a respective organic light-emitting diode (OLED). A semiconducting-oxide transistor may be coupled between a drain terminal and a gate terminal of the drive transistor to help reduce leakage during low-refresh-rate display operations. To compensate for variations in the threshold voltage of the semiconducting-oxide transistor, the magnitude of a high voltage level of a scan control signal provided to the gate terminal of the semiconducting-oxide transistor may be adjusted. Sensing circuitry may be used to sense a display current while displaying a calibration image. The sensed display current may be compared to an expected display current associated with the calibration image. Processing circuitry may update the high voltage level based on the actual display current compared to the expected display current.

16 Claims, 12 Drawing Sheets

(52) U.S. Cl.
CPC . *G09G 2320/043* (2013.01); *G09G 2330/021* (2013.01); *G09G 2330/12* (2013.01); *H01L 29/7866* (2013.01); *H01L 29/7869* (2013.01)

(56) References Cited

U.S. PATENT DOCUMENTS

| | | | |
|---|---|---|---|
| 9,083,320 B2 | 7/2015 | Yang et al. | |
| 9,881,555 B2 | 1/2018 | Park et al. | |
| 2007/0152934 A1* | 7/2007 | Maeda | G09G 3/3233 345/92 |
| 2008/0106500 A1 | 5/2008 | Wacyk | |
| 2013/0169702 A1* | 7/2013 | Ono | G09G 5/10 345/690 |
| 2014/0159998 A1* | 6/2014 | Huang | G01R 19/32 345/92 |
| 2014/0191663 A1* | 7/2014 | Shin | H05B 45/60 315/151 |
| 2015/0170571 A1* | 6/2015 | Park | G09G 3/3258 345/690 |
| 2015/0243718 A1 | 8/2015 | Kwon et al. | |
| 2015/0382465 A1 | 12/2015 | Steyn et al. | |
| 2016/0019839 A1 | 1/2016 | In | |
| 2016/0063922 A1* | 3/2016 | Tsai | G09G 3/3233 345/76 |
| 2016/0180771 A1* | 6/2016 | Jeong | G09G 3/2003 345/211 |
| 2016/0284276 A1 | 9/2016 | Gupta et al. | |
| 2016/0372035 A1* | 12/2016 | Nakatani | G09G 3/3233 |
| 2017/0046004 A1 | 2/2017 | Choi | |
| 2017/0162113 A1 | 6/2017 | Lin et al. | |
| 2017/0365213 A1 | 12/2017 | Rieutort-Louis et al. | |
| 2018/0005592 A1 | 1/2018 | Okamoto | |
| 2018/0061314 A1* | 3/2018 | Kim | G09G 3/3233 |
| 2018/0061329 A1* | 3/2018 | Lee | G09G 3/3291 |
| 2018/0096650 A1* | 4/2018 | Pyeon | G09G 3/3266 |
| 2018/0219987 A1* | 8/2018 | Pantel | G06F 1/1637 |

FOREIGN PATENT DOCUMENTS

| | | |
|---|---|---|
| CN | 204166873 U | 2/2015 |
| CN | 104715721 A | 6/2015 |
| CN | 104751781 A | 7/2015 |
| CN | 106448554 A | 2/2017 |
| CN | 107134269 A | 9/2017 |
| CN | 106504707 B | 6/2018 |
| CN | 108122538 A | 6/2018 |
| CN | 108831398 A | 11/2018 |
| CN | 106205490 B | 1/2019 |
| JP | 2013235025 A | 11/2013 |
| KR | 1020100032184 A | 3/2010 |
| KR | 1020150070875 A | 6/2015 |
| KR | 1020160018825 A | 2/2016 |
| KR | 1020180078852 A | 7/2018 |
| TW | 201331913 A | 8/2013 |
| WO | 2001095301 A1 | 12/2001 |
| WO | 2006005033 A2 | 1/2006 |
| WO | 2015001709 A1 | 1/2015 |

* cited by examiner

ELECTRONIC DEVICES HAVING DISPLAYS WITH COMPENSATION FOR OXIDE TRANSISTOR THRESHOLD VOLTAGE

This application claims priority to CN patent application No. 201910079924.8, filed on Jan. 28, 2019, which is hereby incorporated by reference herein in its entirety.

FIELD

This relates generally to electronic devices and, more particularly, to electronic devices with displays.

BACKGROUND

Electronic devices often include displays. For example, cellular telephones and portable computers include displays for presenting information to users.

Displays such as organic light-emitting diode displays have an array of display pixels based on light-emitting diodes. In this type of display, each display pixel includes a light-emitting diode and thin-film transistors for controlling application of a signal to the light-emitting diode to produce light.

For instance, a display pixel often includes a drive thin-film transistor that controls the amount of current flowing through the light-emitting diode and a switching transistor connected to the gate terminal of the drive thin-film transistor. The switching transistor may be implemented as a semiconducting-oxide transistor, which typically exhibits low leakage when the switching transistor is turned off. This low-leakage property of the semiconducting-oxide switching transistor helps to keep the voltage at the gate terminal of the drive thin-film transistor relatively constant during a given emission period of the display pixel when the drive thin-film transistor passes current to the light-emitting diode to produce light.

The semiconducting-oxide switching transistor, however, exhibits reliability issues over the lifetime of the display. In particular, the semiconducting-oxide transistor has a threshold voltage that drifts over time as the semiconducting-oxide transistor is repeatedly turned on and off. As the threshold voltage of the semiconducting-oxide transistor changes, the voltage at the gate terminal of the drive thin-film transistor immediately prior to emission will also be affected. This directly impacts the amount of current flowing through the light-emitting diode, which controls the amount of light or luminance produced by the display pixel. This sensitivity of the light-emitting diode current to the threshold voltage of the semiconducting-oxide switching transistor increases the risk of non-ideal display behaviors such as luminance drop over the lifetime of the display, undesired color shifts over the lifetime of the display (e.g., resulting in a cyan/greenish tint on the display), etc.

SUMMARY

An electronic device may include a display having an array of display pixels. The display pixels may be organic light-emitting diode display pixels.

Each display pixel may include a light-emitting diode, a drive transistor coupled in series with the light-emitting diode, a transistor of a first semiconductor type (e.g., a semiconducting-oxide thin-film transistor) coupled between the drain terminal and the gate terminal of the drive transistor, a first emission transistor coupled in series with the drive transistor and the light-emitting diode, a second emission transistor coupled in series with the drive transistor and a power line, an initialization transistor coupled to the light-emitting diode, and a data loading transistor coupled to the source terminal of the drive transistor. In particular, the semiconducting-oxide transistor may be configured to reduce leakage at the gate terminal of the drive transistor.

The scan control signal that controls the semiconducting-oxide transistor may be adapted to changes in the threshold voltage of the semiconducting oxide transistor to compensate for any luminance drop in the display. In one compensation scheme, a prediction of the change in threshold voltage of the semiconducting oxide transistor may be used to change the high voltage level of the scan control signal according to a predetermined profile. The changes in the high voltage level of the scan control signal may track the changes in the threshold voltage of the semiconducting oxide transistor, preventing luminance drop in the display.

In another suitable arrangement, current sensing circuitry may be coupled to the display to measure a display current while a calibration image is displayed. The expected display current associated with the calibration image may be known. The actual display current (obtained by the current sensing circuitry) may be compared to the expected display current. Differences between the actual and expected display current may occur due to changes of the threshold voltage of the semiconducting oxide transistor. If a difference is detected, the high voltage level of the scan control signal of the semiconducting oxide transistor may be compensated accordingly. In one example, the high voltage level may be set based on a lookup table that includes information associated with the expected display current, actual display current, and temperature. In another example, the high voltage level may be adjusted incrementally until the actual display current matches the expected display current.

DETAILED DESCRIPTION

Figure 1:
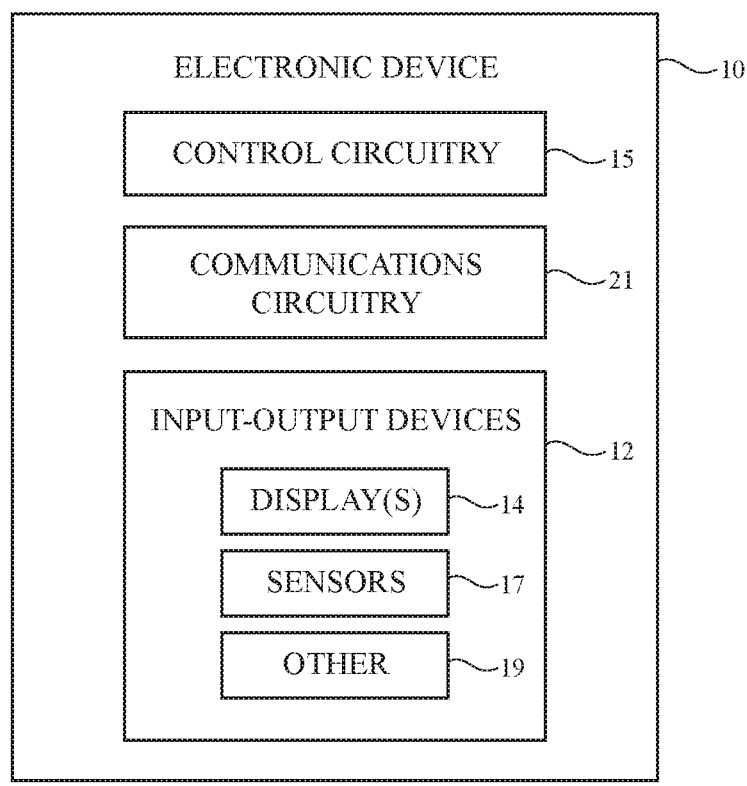
FIG. 1 is a diagram of an illustrative electronic device having a display in accordance with an embodiment.

An illustrative electronic device of the type that may be provided with an organic light-emitting diode display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

Device 10 may include control circuitry 15. Control circuitry 15 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 15 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 15 may communicate using communications circuitry 21. Circuitry 21 may include antennas, radio-frequency transceiver circuitry, and other wireless communications circuitry and/or wired communications circuitry. Circuitry 21, which may sometimes be referred to as control circuitry and/or control and communications circuitry, may support bidirectional wireless communications between device 10 and external equipment over a wireless link (e.g., circuitry 21 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a 60 GHz link or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 12. Devices 12 may be mounted in a housing of the electronic device (e.g., an electronic device housing formed from metal and/or glass that forms exterior surfaces of the electronic device). In cases where electronic device 10 is a wristwatch device, a wrist strap may be attached to the electronic device housing. For example, the wrist strap may be attached to first and second opposing sides of the electronic device housing, with display 14 interposed between the first and second opposing sides. Input-output devices 12 may be used in gathering user input, in gathering information on the environment surrounding the user, and/or in providing a user with output. Devices 12 may include one or more displays such as display(s) 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Display 14 may have an array of pixels configured to display images for a user. The display pixels may be formed on a substrate such as a flexible substrate (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 17 in input-output devices 12 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 17 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 17 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

If desired, electronic device 10 may include additional components (see, e.g., other devices 19 in input-output devices 12). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
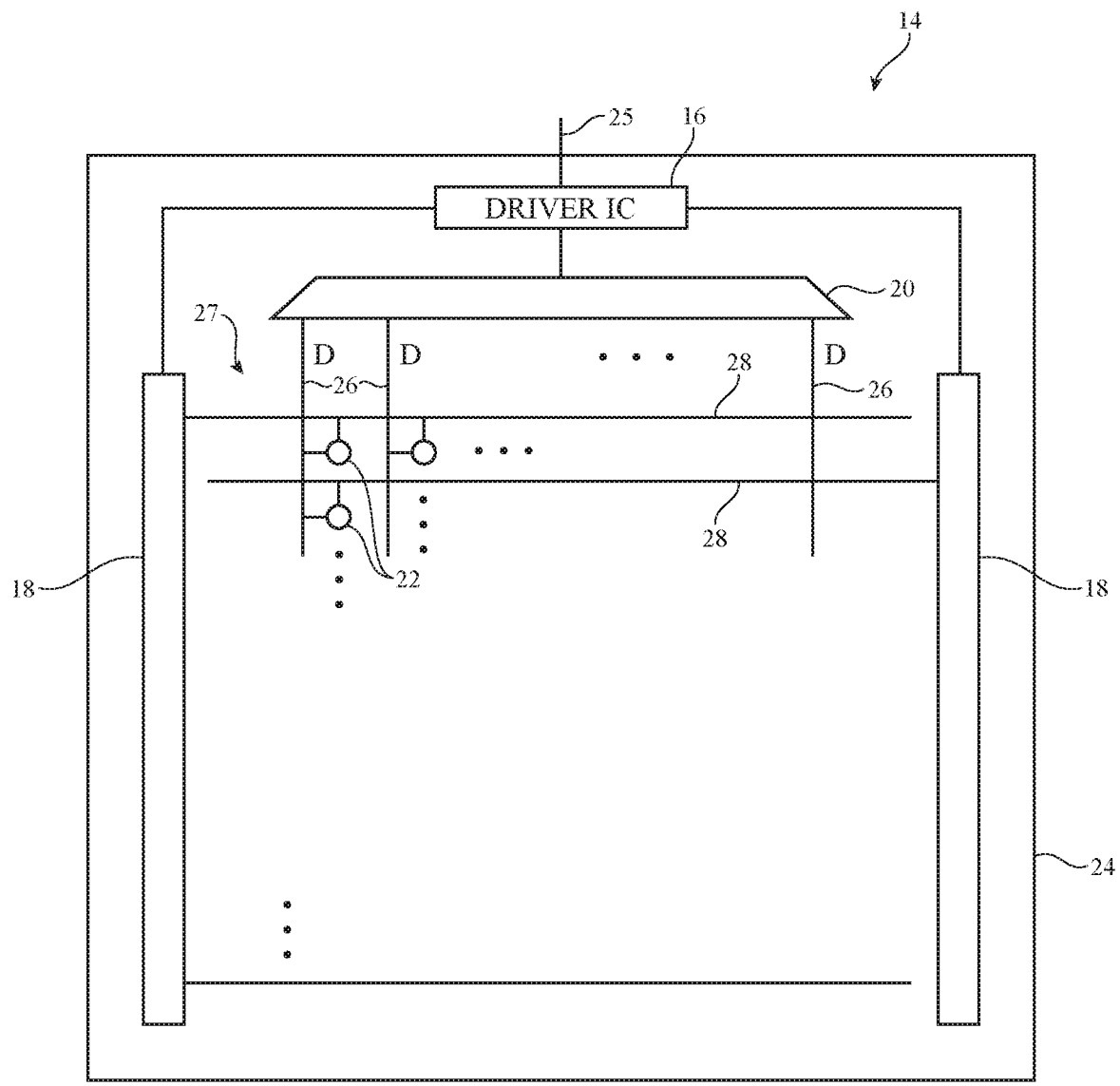
FIG. 2 is a diagram of an illustrative organic light-emitting diode display having an array of organic light-emitting diode (OLED) display pixels in accordance with an embodiment.

A display in an electronic device may be provided with driver circuitry for displaying images on an array of display pixels. An illustrative display is shown in FIG. 2. As shown in FIG. 2, display 14 may have one or more layers such as substrate 24. Layers such as substrate 24 may be formed from planar rectangular layers of material such as planar glass layers. Display 14 may have an array 27 of display pixels 22 for displaying images for a user. The array of display pixels 22 may be formed from rows and columns of display pixel structures on substrate 24. These structures may include thin-film transistors such as polysilicon thin-film transistors (e.g., thin-film transistors having an active region formed from polysilicon), semiconducting oxide thin-film transistors (e.g., thin-film transistors having an active region formed from semiconducting oxide), etc. There may be any suitable number of rows and columns in the array of display pixels 22 (e.g., ten or more, one hundred or more, or one thousand or more).

Display driver circuitry such as display driver integrated circuit 16 may be coupled to conductive paths such as metal traces on substrate 24 using solder or conductive adhesive. Display driver integrated circuit 16 (sometimes referred to as a timing controller chip) may contain communications circuitry for communicating with system control circuitry over path 25. Path 25 may be formed from traces on a flexible printed circuit or other cable. The system control circuitry may be located on a main logic board in an electronic device such as a cellular telephone, computer, computer tablet, television, set-top box, media player, wrist watch, portable electronic device, or other electronic equipment in which display 14 is being used. During operation, the system control circuitry may supply display driver integrated circuit 16 with information on images to be displayed on display 14 via path 25. To display the images on display pixels 22, display driver integrated circuit 16 may supply clock signals and other control signals to display driver circuitry such as row driver circuitry 18 and column driver circuitry 20. Row driver circuitry 18 and/or column driver circuitry 20 may be formed from one or more integrated circuits and/or one or more thin-film transistor circuits on substrate 24.

Row driver circuitry 18 may be located on the left and right edges of display 14, on only a single edge of display 14, or elsewhere in display 14. During operation, row driver circuitry 18 may provide row control signals on horizontal lines 28 (sometimes referred to as row lines or "scan" lines). Row driver circuitry 18 may therefore sometimes be referred to as scan line driver circuitry. Row driver circuitry 18 may also be used to provide other row control signals such as emission control lines, if desired.

Column driver circuitry 20 may be used to provide data signals D from display driver integrated circuit 16 onto a plurality of corresponding vertical lines 26. Column driver circuitry 20 may sometimes be referred to as data line driver circuitry or source driver circuitry. Vertical lines 26 are sometimes referred to as data lines. During compensation operations, column driver circuitry 20 may use paths such as vertical lines 26 to supply a reference voltage. During programming operations, display data is loaded into display pixels 22 using lines 26.

Each data line 26 is associated with a respective column of display pixels 22. Sets of horizontal signal lines 28 run horizontally through display 14. Power supply paths and other lines may also supply signals to pixels 22. Each set of horizontal signal lines 28 is associated with a respective row of display pixels 22. The number of horizontal signal lines in each row may be determined by the number of transistors in the display pixels 22 that are being controlled independently by the horizontal signal lines. Display pixels of different configurations may be operated by different numbers of control lines, data lines, power supply lines, etc.

Row driver circuitry 18 may assert control signals on the row lines 28 in display 14. For example, driver circuitry 18 may receive clock signals and other control signals from display driver integrated circuit 16 and may, in response to the received signals, assert control signals in each row of display pixels 22. Rows of display pixels 22 may be processed in sequence, with processing for each frame of image data starting at the top of the array of display pixels and ending at the bottom of the array (as an example). While the scan lines in a row are being asserted, the control signals and data signals that are provided to column driver circuitry 20 by circuitry 16 direct circuitry 20 to demultiplex and drive associated data signals D onto data lines 26 so that the display pixels in the row will be programmed with the display data appearing on the data lines D. The display pixels can then display the loaded display data.

In an organic light-emitting diode (OLED) display such as display 14, each display pixel contains a respective organic light-emitting diode for emitting light. A drive transistor controls the amount of light output from the organic light-emitting diode. Control circuitry in the display pixel is configured to perform threshold voltage compensation operations so that the strength of the output signal from the organic light-emitting diode is proportional to the size of the data signal loaded into the display pixel while being independent of the threshold voltage of the drive transistor.

Figure 3:
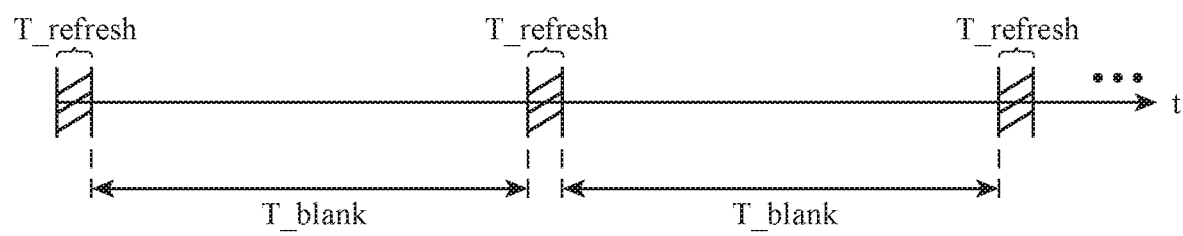
FIG. 3 is a diagram of a low refresh rate display driving scheme in accordance with an embodiment.

Display 14 may be configured to support low refresh rate operation. Operating display 14 using a relatively low refresh rate (e.g., a refresh rate of 1 Hz, 2 Hz, 1-10 Hz, less than 100 Hz, less than 60 Hz, less than 30 Hz, less than 10 Hz, less than 5 Hz, less than 1 Hz, or other suitably low rate) may be suitable for applications outputting content that is static or nearly static and/or for applications that require minimal power consumption. FIG. 3 is a diagram of a low refresh rate display driving scheme in accordance with an embodiment. As shown in FIG. 3, display 14 may alternate between a short data refresh phase (as indicated by period T_refresh) and an extended blanking period T_blank. During period T_refresh, the data value in each display pixel may be refreshed, "repainted," or updated.

As an example, each data refresh period T_refresh may be approximately 16.67 milliseconds (ms) in accordance with a 60 Hz data refresh operation, whereas each period T_blank may be approximately 1 second so that the overall refresh rate of display 14 is lowered to 1 Hz (as an example of a low refresh rate display operation). Configured as such, the duration of T_blank can be adjusted to tune the overall refresh rate of display 14. For example, if the duration of T_blank is tuned to half a second, the overall refresh rate would be increased to 2 Hz. As another example, if the duration of T_blank was tuned to a quarter of a second, the overall refresh rate would be increased to 4 Hz. In the embodiments described herein, the blanking interval T_blank may be at least two times the duration of T_refresh, at least 10 times the duration of T_refresh, at least 20 times the duration of T_refresh, at least 30 times the duration of T_refresh, at least 60 times the duration of T_refresh, 2-100 times the duration of T_refresh, more than 100 times the duration of T_refresh, etc.

Figure 4:
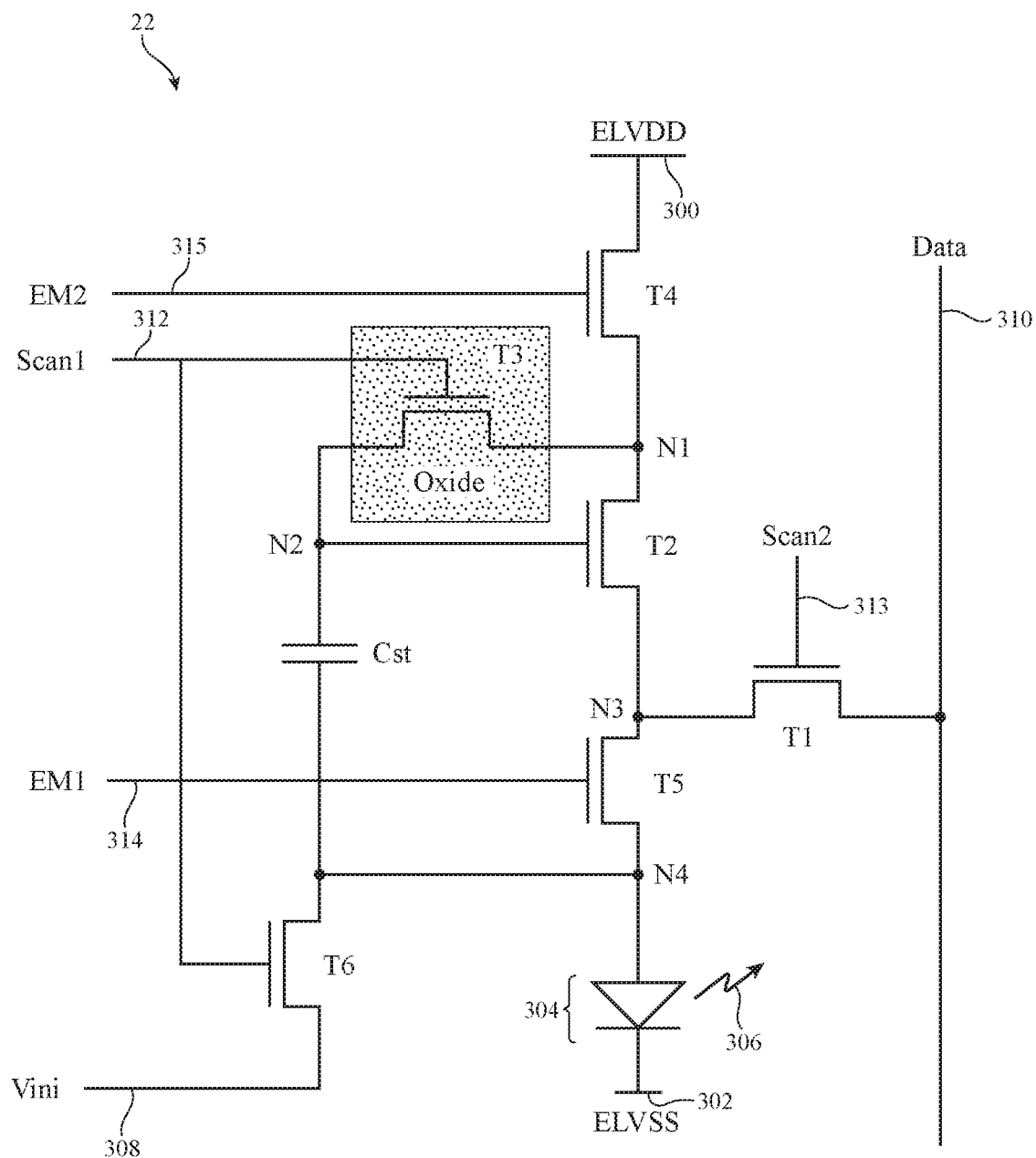
FIG. 4 is a circuit diagram of an organic light-emitting diode display pixel configured to produce an emission current in accordance with an embodiment.

A schematic diagram of an illustrative organic light-emitting diode display pixel 22 in display 14 that can be used to support low refresh rate operation is shown in FIG. 4. As shown in FIG. 4, display pixel 22 may include a storage capacitor Cst and transistors such as n-type (i.e., n-channel) transistors T1, T2, T3, T4, T5, and T6. The transistors of pixel 22 may be thin-film transistors formed from a semiconductor such as silicon (e.g., polysilicon deposited using a low temperature process, sometimes referred to as LTPS or low-temperature polysilicon), semiconducting oxide (e.g., indium gallium zinc oxide (IGZO)), or other suitable semiconductor material. In other words, the active region and/or the channel region of these thin-film transistors may be formed from polysilicon or semi-conducting oxide material.

Display pixel 22 may include light-emitting diode 304. A positive power supply voltage ELVDD (e.g., 1 V, 2 V, more than 1 V, 0.5 to 5 V, 1 to 10 V, or other suitable positive voltage) may be supplied to positive power supply terminal 300 and a ground power supply voltage ELVSS (e.g., 0 V, −1 V, −2 V, or other suitable negative voltage) may be supplied to ground power supply terminal 302. The power supply voltages ELVDD and ELVSS may be provided to terminals 300 and 302 from respective power supply traces. For example, a conductive layer may serve as a ground power supply voltage trace that provides the ground power supply voltage ELVSS to all of the pixels within the display. The state of transistor T2 controls the amount of current flowing from terminal 300 to terminal 302 through diode 304 and therefore controls the amount of emitted light 306 from display pixel 22. Transistor T2 is therefore sometimes referred to as the "drive transistor." Diode 304 may have an associated parasitic capacitance $C_{OLED}$ (not shown).

Terminal 308 is used to supply an initialization voltage Vini (e.g., a positive voltage such as 1 V, 2 V, less than 1 V, 1 to 5 V, or other suitable voltage) to assist in turning off diode 304 when diode 304 is not in use. Control signals from display driver circuitry such as row driver circuitry 18 of FIG. 2 are supplied to control terminals such as terminals 312, 313, 314, and 315. Terminals 312 and 313 may serve respectively as first and second scan control terminals, whereas terminals 314 and 315 may serve respectively as first and second emission control terminals. Scan control signals Scan1 and Scan2 may be applied to scan terminals 312 and 313, respectively. Emission control signals EM1 and EM2 may be supplied to terminals 314 and 315, respectively. A data input terminal such as data signal terminal 310 is coupled to a respective data line 26 of FIG. 2 for receiving image data for display pixel 22.

Transistors T4, T2, T5, and diode 304 may be coupled in series between power supply terminals 300 and 302. In particular, transistor T4 has a drain terminal that is coupled to positive power supply terminal 300, a gate terminal that receives emission control signal EM2, and a source terminal (labeled as node N1) coupled to transistors T2 and T3. The terms "source" and "drain" terminals of a transistor can sometimes be used interchangeably. Drive transistor T2 has a drain terminal that is coupled to node N1, a gate terminal coupled to node N2, and a source terminal coupled to node N3. Transistor T5 has a drain terminal that is coupled to node N3, a gate terminal that receives emission control signal EM1, and a source terminal coupled to node N4. Node N4 is coupled to ground power supply terminal 302 via organic light-emitting diode 304.

Transistor T3, capacitor Cst, and transistor T6 are coupled in series between node N1 and terminal 308. In particular, transistor T3 has a drain terminal that is coupled to node N1, a gate terminal that receives scan control signal Scan1 from scan line 312, and a source terminal that is coupled to node N2. Storage capacitor Cst has a first terminal that is coupled to node N2 and a second terminal that is coupled to node N4. Transistor T6 has a drain terminal that is coupled to node N4, a gate terminal that receives scan control signal Scan1 via scan line 312, and a source terminal that receives initialization voltage Vini via terminal 308.

Transistor T1 has a drain terminal that receives a data signal via data line 310, a gate terminal that receives scan control signal Scan2 via scan line 313, and a source terminal that is coupled to node N3. Connected in this way, emission control signal EM2 may be asserted to enable transistor T4 (e.g., signal EM2 may be driven to a high voltage level to turn on transistor T4); emission control signal EM1 may be asserted to activate transistor T5; scan control signal Scan2 may be asserted to turn on transistor T1; and scan control signal Scan1 may be asserted to simultaneously switch on transistors T3 and T6. Transistors T4 and T5 may sometimes be referred to as emission transistors. Transistor T6 may sometimes be referred to as an initialization transistor. Transistor T1 may sometimes be referred to as a data loading transistor.

In one suitable arrangement, transistor T3 may be implemented as a semiconducting-oxide transistor while remaining transistors T1, T2, and T4-T6 are silicon transistors. Semiconducting-oxide transistors exhibit relatively lower leakage than silicon transistors, so implementing transistor T3 as a semiconducting-oxide transistor will help reduce flicker at low refresh rates (e.g., by preventing current from leaking through T3 when signal Scan1 is deasserted or driven low).

Figure 5:
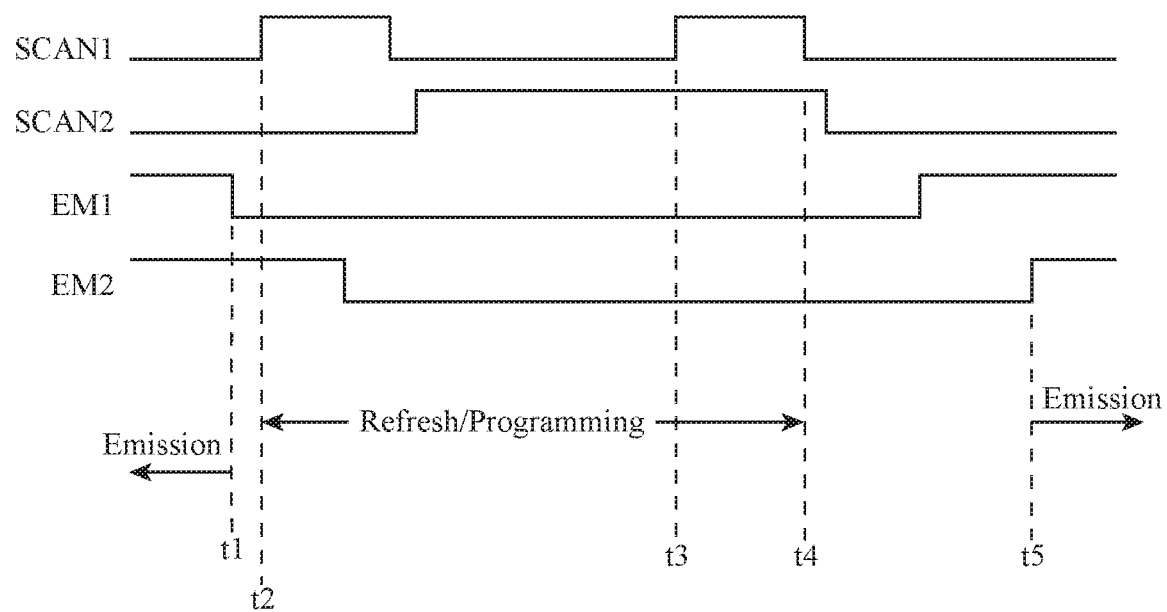
FIG. 5 is a timing diagram that illustrates the operation of the organic light-emitting diode display pixel shown in FIG. 4.

FIG. 5 is a timing diagram that illustrates the operation of organic light-emitting diode display pixel 22 shown in FIG. 4. Prior to time t1, signals Scan1 and Scan2 are deasserted (e.g., the scan control signals are both at low voltage levels), whereas signals EM1 and EM2 are asserted (e.g., the emission control signals are both at high voltage levels). When both emission control signals EM1 and EM2 are high, an emission current will flow through drive transistor T2 into the corresponding organic light-emitting diode 304 to produce light 306 (see FIG. 4). The emission current is sometimes referred to as the OLED current or OLED emission current, and the period during which the OLED current is actively producing light at diode 304 is referred to as the emission phase.

At time t1, emission control signal EM1 is deasserted (i.e., driven low) to temporarily suspend the emission phase, which begins a data refresh or data programming phase. At time t2, signal Scan1 may be pulsed high to activate transistors T3 and T6, which initializes the voltage across capacitor Cst to a predetermined voltage difference (e.g., ELVDD minus Vini).

At time t3, scan control signal Scan1 is pulsed high while signal Scan2 is asserted and while signals EM1 and EM2 are both deasserted to load a desired data signal from data line 310 into display pixel 22. At time t4, scan control signal Scan1 is deasserted (e.g., driven low), which signifies the end of the data programming phase. The emission phase then commences at t5 when emission control signals EM1 and EM2 are reasserted.

Although implementing transistor T3 as a semiconducting-oxide transistor helps minimize leakage current at the gate terminal of drive transistor T2, semiconducting-oxide transistor T3 may suffer from reliability issues. During data programming operations of display pixel 22, scan clock signal Scan1 may be pulled up to a high voltage level VSH (e.g., 10.5 V, more than 10 V, 1-10 V, more than 5 V, 1-5 V, 7-11 V, 10-15 V, 20 V, more than 20 V, or other suitable positive/elevated voltage level) and also pulled down to a low voltage level VGL (e.g., −5 V, −1 V, 0 to −5 V, −5 to −10 V, less than 0 V, less than −1 V, less than −4 V, less than −5 V, less than −10 V, or other suitable negative/depressed voltage level). In particular, the application of negative voltage VGL at the gate terminal of semiconducting-oxide transistor T3 during the emission phase places a negative gate-to-source voltage stress across transistor T3, which can lead to oxide degradation (sometimes referred to as aging effects) and will cause the threshold voltage of semiconducting oxide transistor T3 (sometimes referred to as Vth_ox) to drift over time.

Figure 6:
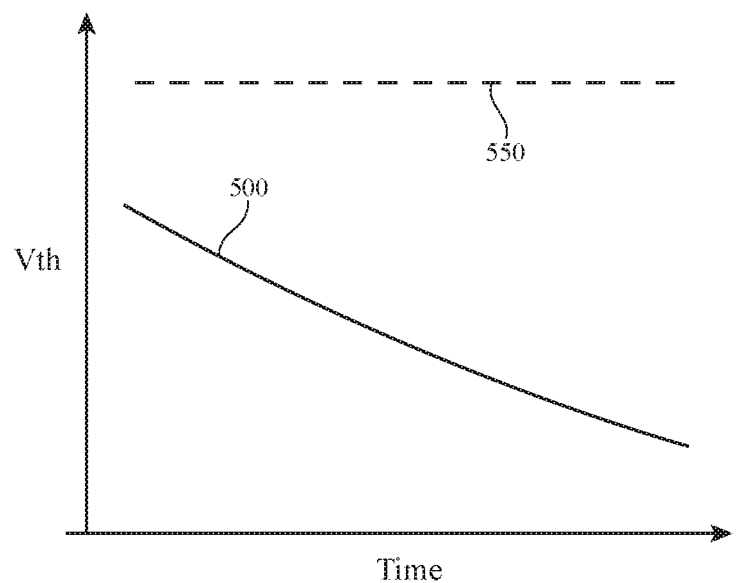
FIG. 6 is a diagram illustrating how the threshold voltage of a semiconducting-oxide transistor and how the threshold voltage of a silicon transistor vary over time in accordance with an embodiment.

FIG. 6 is a diagram illustrating how the threshold voltage of semiconducting-oxide transistor T3 varies over time. Trace 550 represents the threshold voltage of a silicon transistor over the lifetime of display 14. As shown, the threshold voltage may remain relatively steady throughout the lifetime of the display. In contrast, trace 500 represents the threshold voltage of semiconducting-oxide transistor T3 over the lifetime of display 14. As illustrated by trace 500, Vth_ox will change over time (e.g., over 1-4 weeks of normal display operation, over 1-12 months of normal display operation, over at least one year of display operation, over 1-5 years of display operation, over 1-10 years of display operation, etc.). In particular, Vth_ox may decrease over time as the display operates. This may be in a problem in cases where display 14 is expected to be used much of the day (e.g., a display in a wearable device such as a wristwatch device, sometimes referred to as an 'always on' display), as Vth_ox may degrade more quickly (due to frequent use) than in displays that are not 'always on.'

Figure 7:
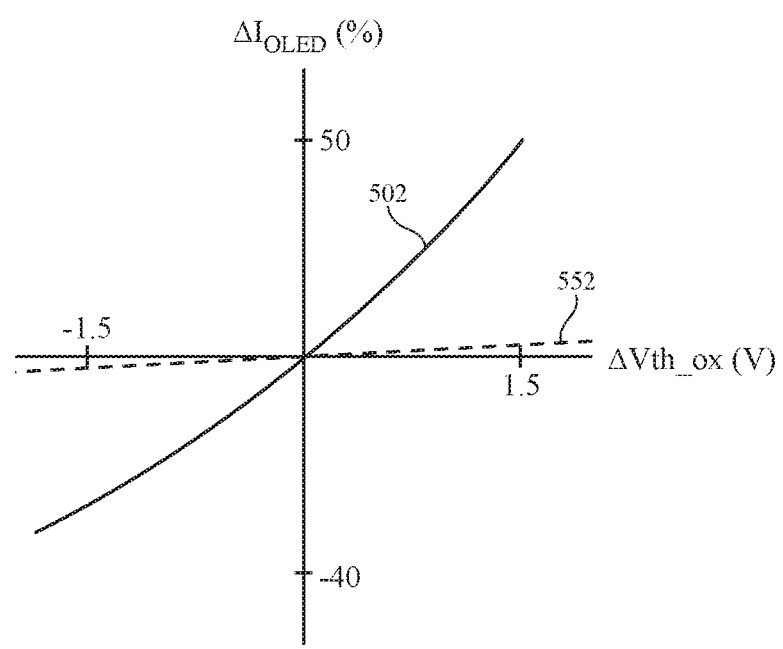
FIG. 7 is a diagram illustrating the sensitivity of OLED emission current to the threshold voltage of the semiconducting-oxide transistor in the organic light-emitting diode display pixel shown in FIG. 4 in accordance with an embodiment.

FIG. 7 plots the percentage change of the OLED emission current $I_{OLED}$ as a function of the amount of voltage change in Vth_ox. As shown by trace 552, the OLED emission current $I_{OLED}$ is not very sensitive to changes in the threshold voltage of silicon transistors within the pixel. Trace 502 illustrates the sensitivity of $I_{OLED}$ to threshold voltage Vth_ox of transistor T3 in organic light-emitting diode display pixel 22 of FIG. 4. As shown by trace 502 in FIG. 7, current $I_{OLED}$ may increase by approximately 50% if Vth_ox deviates from the nominal threshold voltage amount by 1.5 V and may decrease by approximately 40% if Vth_ox deviates from the nominal threshold voltage amount by −1.5 V. This relatively high sensitivity of the OLED current to changes in Vth_ox as represented by trace 502 can cause non-ideal behaviors such as luminance drop and undesired color shifts in the display as Vth_ox drifts over time.

Figure 8:
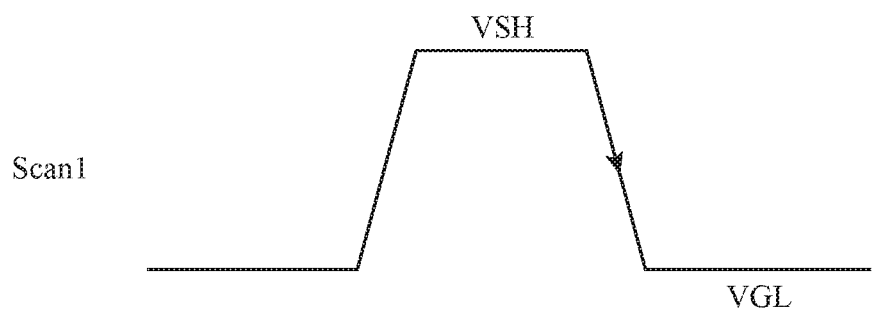
FIG. 8 is a diagram of a scan control signal that may be provided to the gate of a semiconducting-oxide transistor such as T3 in FIG. 4 in accordance with an embodiment.

FIG. 8 is a diagram of a scan control signal (e.g., Scan1) that is used to control T3 during operation of pixel 22. As shown, the control signal may rise to a positive voltage level VSH to assert transistor T3. To turn off T3 (among other transistors), signal Scan 1 may be driven from the positive voltage level VSH (sometimes referred to as an active voltage level, on voltage level, or high voltage level) to a negative voltage level VGL (sometimes referred to as an inactive voltage level, off voltage level, or low voltage level).

When T3 is deasserted (by driving scan control signal Scan1 from VSH to VGL), the voltage on N2 may change by an amount that is proportional to the difference between VSH and Vth_ox (e.g., $\Delta V \propto VSH-Vth\_ox$). As the voltage on N2 controls the amount of current through diode 304 and therefore the luminance of the pixel, precise control of the N2 voltage is important for optimal operation of the display. The Vth_ox drift experienced by T3 therefore causes non-ideal behaviors (because it causes the ΔV on N2 to vary over time). To prevent non-ideal behaviors caused by the Vth_ox drift, VSH may be changed to track the changes in Vth_ox. If VSH is changed by a similar amount to Vth_ox, then ΔV will remain constant over time (despite the Vth_ox drift).

Figure 9:
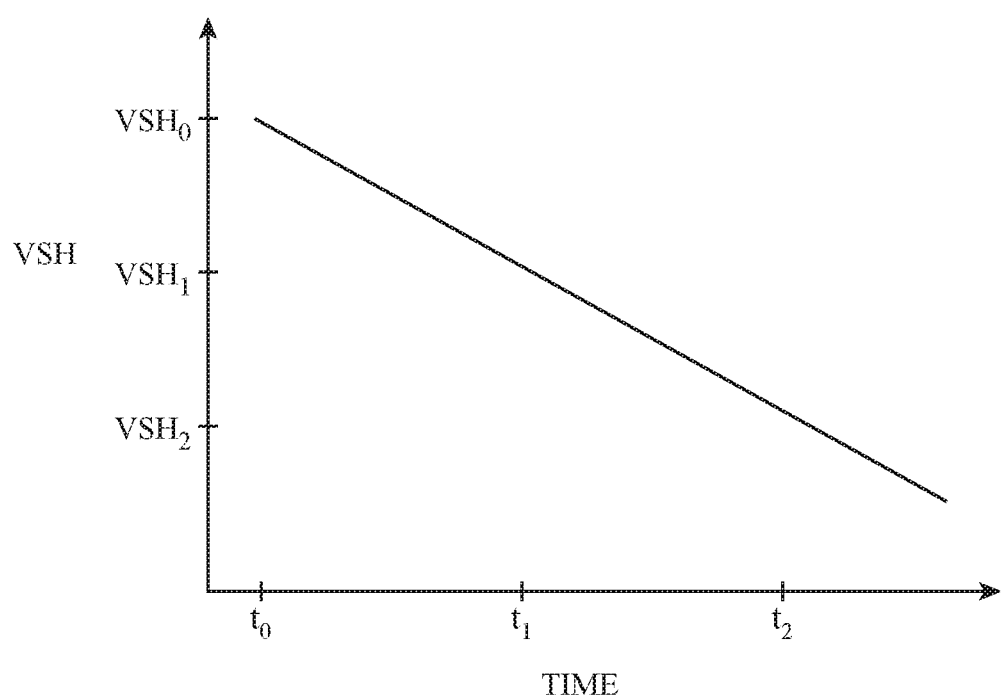
FIG. 9 is a diagram illustrating how the high voltage level of the scan control signal of a semiconducting oxide transistor in a pixel may be predictively decreased to track expected drift in the threshold voltage of the transistor in accordance with an embodiment.

There are numerous schemes that may be used to update VSH to compensate for Vth_ox drift. In one example, VSH may drop at a predetermined rate based on the expected Vth_ox drop over time. FIG. 9 is a diagram showing how VSH of scan control signal Scan1 can be adjusted to adapt to the changes in Vth_ox and thereby mitigate display luminance drop in accordance with an embodiment. At time $T_0$ (i.e., when the display is still relatively new), VSH may be biased at a nominal positive power supply level $VSH_0$. After some period of time and at time T1, the luminance of display 14 might have dropped by some amount due to the threshold voltage drift of oxide transistor T3. The amount of time between T0 and T1 might be at least 50 hours, at least 100 hours, 100 to 500 hours, more than 500 hours, or other suitable time period of operation during which display 14 might have suffered from undesirable changes in luminance. To mitigate the luminance drop, VSH might be reduced to a new positive power supply level $VSH_1$. After an additional period of time and at time T2, the luminance of display 14 might have dropped by some amount due to the threshold voltage drift of oxide transistor T3 between $t_1$ and $t_2$. The amount of time between T1 and T2 might be at least 50 hours, at least 100 hours, 100 to 500 hours, more than 500 hours, or other suitable time period of operation during which display 14 might have suffered from undesirable changes in luminance. To mitigate the luminance drop, VSH might be reduced to a new positive power supply level $VSH_2$.

This process may continue indefinitely until the end of the life cycle of display 14, lasting for least 2 years of normal operational use, 2-5 years or normal operational, 5-10 years of normal operational use, or more than 10 years of normal operational usage.

VSH may be adjusted by display driver integrated circuit 16. Alternatively, additional control and processing circuitry (e.g., control circuitry 15 in FIG. 1) may send instructions to display driver integrated circuit 16 to update VSH. To know when and by how much to adjust VSH, testing may be done to determine an average drift curve for Vth_ox. For example, a given number of devices (e.g., one hundred devices, five hundred devices, more than one hundred devices, more than one thousand devices, less than one thousand devices, etc.) may have their Vth_ox monitored over time. The average Vth_ox value of the devices may be obtained at various times. The average Vth_ox values may then be used to create an average Vth_ox drift curve. The average Vth_ox drift curve may inform the VSH updates. VSH may be updated in a stepwise fashion that approximates the Vth_ox drift curve, if desired.

During use of an electronic device, the actual Vth_ox drift may deviate from the average Vth_ox drift curve. However, updating VSH according to the average Vth_ox drift curve may still improve display performance relative to displays where VSH is never updated. To further improve display performance, current sensing may be used to actively monitor display performance and periodically update VSH to maintain display brightness. VSH is therefore updated based on a real-time data instead of a predicted Vth_ox change.

Figure 10:
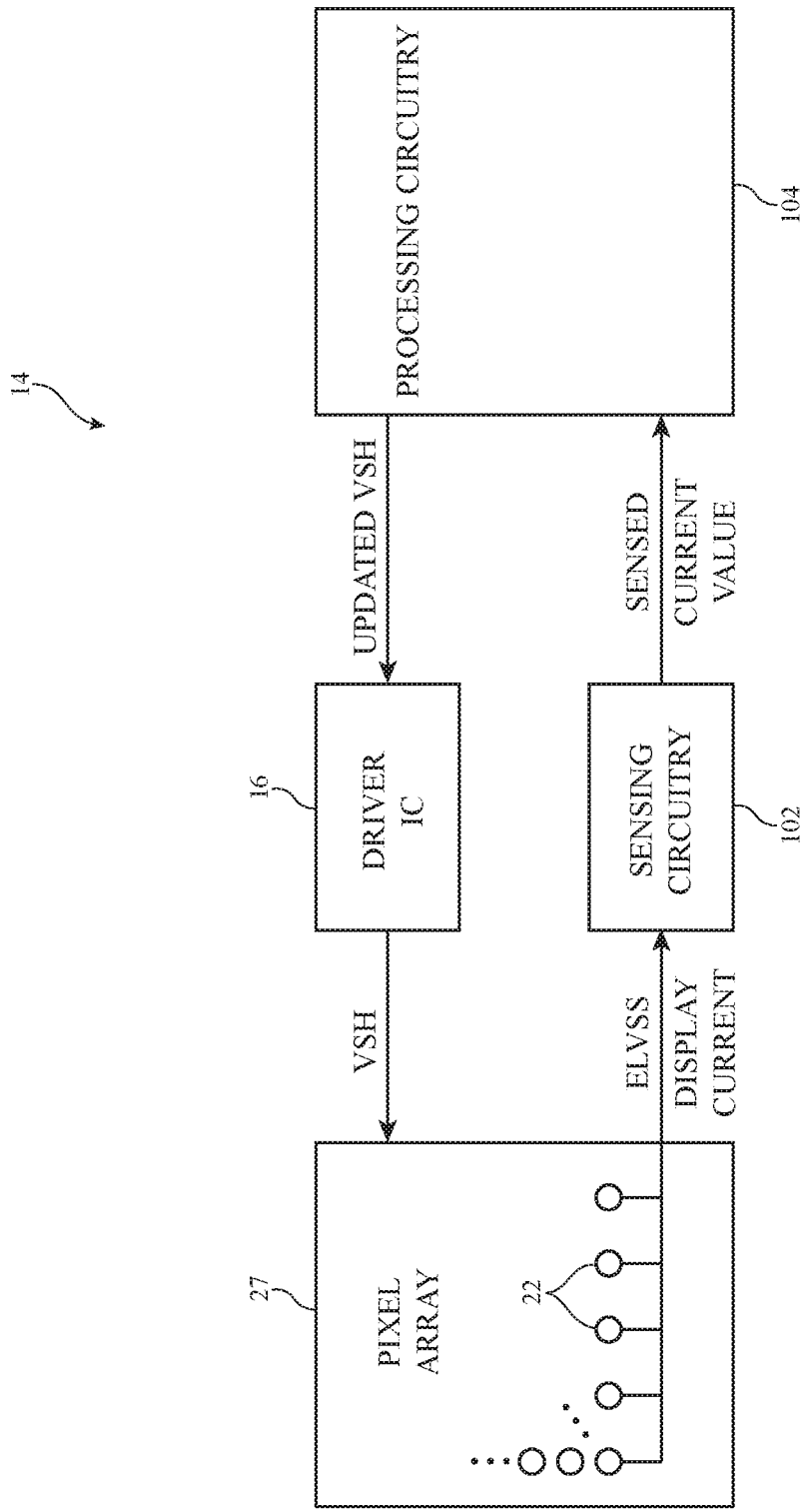
FIG. 10 is a schematic diagram of an illustrative display that includes sensing circuitry for actively monitoring display current and accordingly compensating the high voltage level of the scan control signal of a semiconducting oxide transistor in accordance with an embodiment.

A schematic diagram of an illustrative display that includes sensing circuitry for active VSH compensation is shown in FIG. 10. As shown in FIG. 10, display 14 includes a pixel array 27 with a plurality of pixels 22. Each pixel may be coupled to the ground power supply trace ELVSS. In one illustrative example, ground power supply trace ELVSS may be a blanket metal layer that is formed over the entire pixel array, with each pixel having a corresponding diode terminal electrically connected to the blanket metal layer.

To actively compensate VSH, an image (e.g., a calibration image) may first be displayed on the pixel array using a starting VSH value. The VSH value may be provided to the pixel array from display driver integrated circuit 16. Ground power supply trace ELVSS (sometimes referred to as ground power supply terminal ELVSS) may be electrically connected to sensing circuitry 102. Sensing circuitry 102 may include circuit components that allow the detection of the current at ground power supply terminal ELVSS while the calibration image is displayed by the pixel array. Sensing circuitry 102 may output the sensed current value to processing circuitry 104. Processing circuitry 104 may use the sensed current value to determine an updated VSH value that is then provided to the display driver integrated circuit.

To allow processing circuitry 104 to update VSH based on the sensed current value while the calibration image is displayed, expected display current values may be needed. For example, testing may be performed before manufacturing of the device is completed to determine that, when the calibration image is displayed at a first brightness value, a first display current value should be sensed by sensing circuitry 102. Then, during operation of the device, the calibration image may be displayed at the first brightness value. If the sensed display current value matches the expected, first display current value, processing circuitry 104 may determine that the display is operating correctly and no changes to VSH are required. However, if the sensed display current value is different (e.g., lower) than the first display current value, processing circuitry may determine that VSH needs to be updated to correct for Vth_ox drift. Calibration at numerous brightness levels and temperatures may be performed to determine the expected display current value in a variety of conditions. Then, when operating the electronic device, the actual display current value may be compared to the expected display current value for the present conditions. The processing circuitry may then take remedial action (e.g., updating VSH) based on the comparison.

Figure 11:
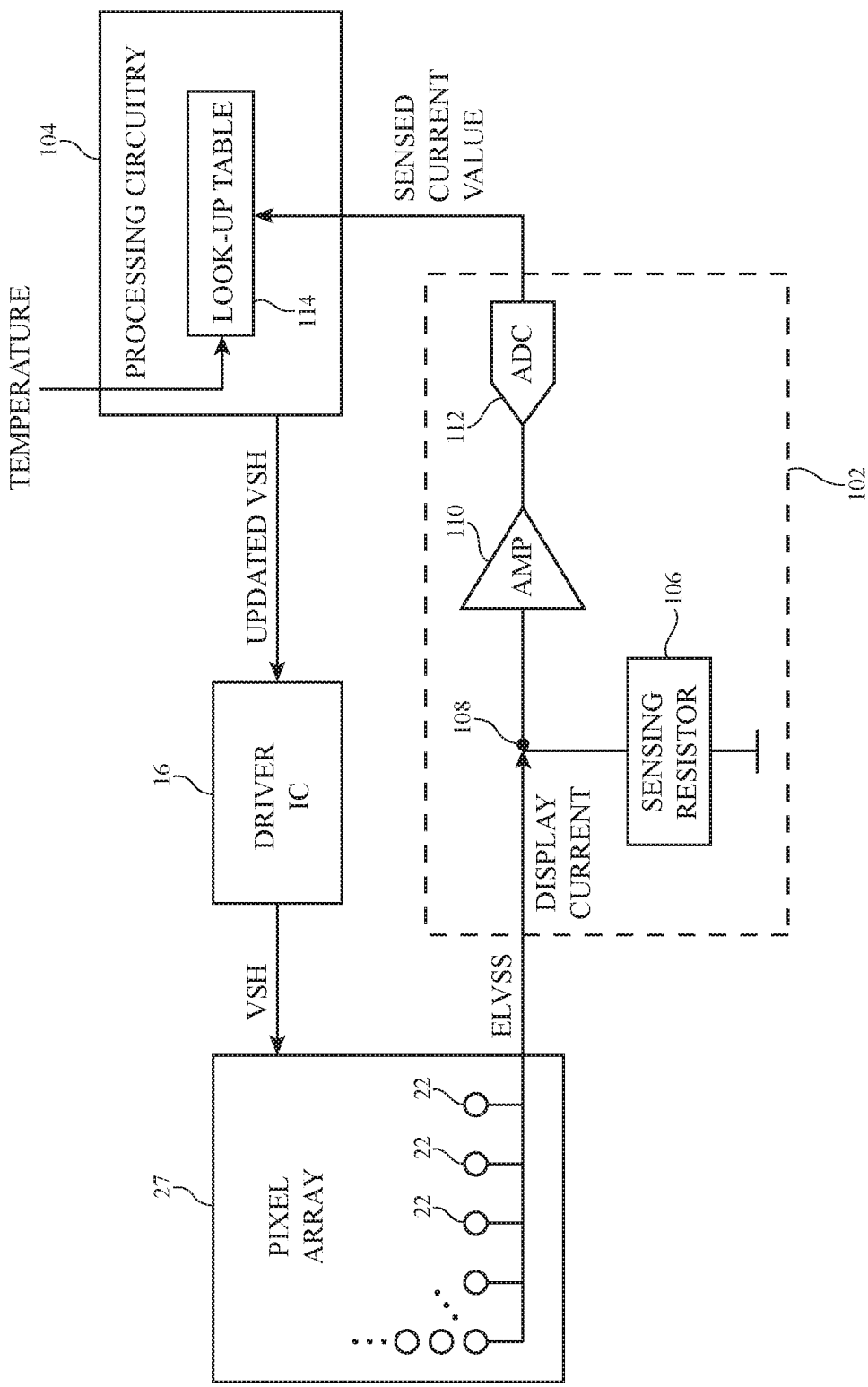
FIG. 11 is a schematic diagram of an illustrative display that includes a sensing resistor and analog-to-digital converter for actively monitoring display current in accordance with an embodiment.

Any desired circuitry may be used to form the sensing circuitry of FIG. 10. FIG. 11 is a schematic diagram of an illustrative embodiment for sensing circuitry 102 in which a sensing resistor is used to sense the display current. As shown in FIG. 102, ground power supply terminal ELVSS may be coupled to sensing resistor 106. By sinking the display current into sensing resistor 106, a voltage proportional to the current may be present at node 108, which may optionally be coupled to an amplifier 110. Amplifier 110 may amplify the voltage from node 108 to allow for higher resolution current sensing (and therefore more accurate sensing at low current levels). Amplifier 110 may optionally be omitted if desired. The voltage from node 108 (either amplifier or not amplified) may be provided to analog-to-digital converter (ADC) 112. The sensed current value output from ADC 112 may be a digital value representative of the display current.

Processing circuitry 104 may receive the sensed current value and determine an updated VSH value based on the sensed current value. Processing circuitry 104 may factor in other information when determining an updated VSH value. For example, the display current may be dependent on the ambient temperature in which the electronic device operates. Processing circuitry 104 may use a lookup table 114 to determine an updated VSH. The lookup table may output an updated VSH value based on the temperature (e.g., temperature data received from a temperature sensor), the actual display current, the display brightness, and/or the expected display current. Once the updated VSH value is determined, the updated VSH value may be provided to display driver IC 16 for subsequent operation of the display.

The examples of sensing circuitry 102 and processing circuitry 104 shown in FIG. 11 are merely illustrative. In general, sensing circuitry 102 may include any desired circuit components. Additionally, in FIGS. 10 and 11 the sensing circuitry is depicted as being formed separately from the display driver integrated circuit 16 (e.g., sensing circuitry may be formed as discrete components outside of the display driver IC). This example is merely illustrative. Sensing circuitry 102 may instead be incorporated into display driver IC 16 if desired. Similarly, in FIGS. 10 and 11 processing circuitry 104 is depicted as being formed separately from the display driver integrated circuit 16. For example, processing circuitry 104 may be formed as part of control circuitry 15 in FIG. 1, may be formed in the main processor for the electronic device, etc. These examples are merely illustrative, and processing circuitry 104 may be incorporated into display driver IC 16 if desired.

In the embodiments of FIGS. 10 and 11, the display senses current for the entire display globally (e.g., the current at ground power supply terminal ELVSS that is electrically connected to all of the pixels in the pixel array). It should be understood that, in other embodiments, each pixel (or groups of pixels with more than one pixel but less than all of the pixels in the array) may have its current measured and the VSH for that pixel may be updated locally. In other words, VSH may instead be updated on a per-pixel basis instead of globally. However, herein the example of VSH being updated globally will be discussed.

Figure 12:
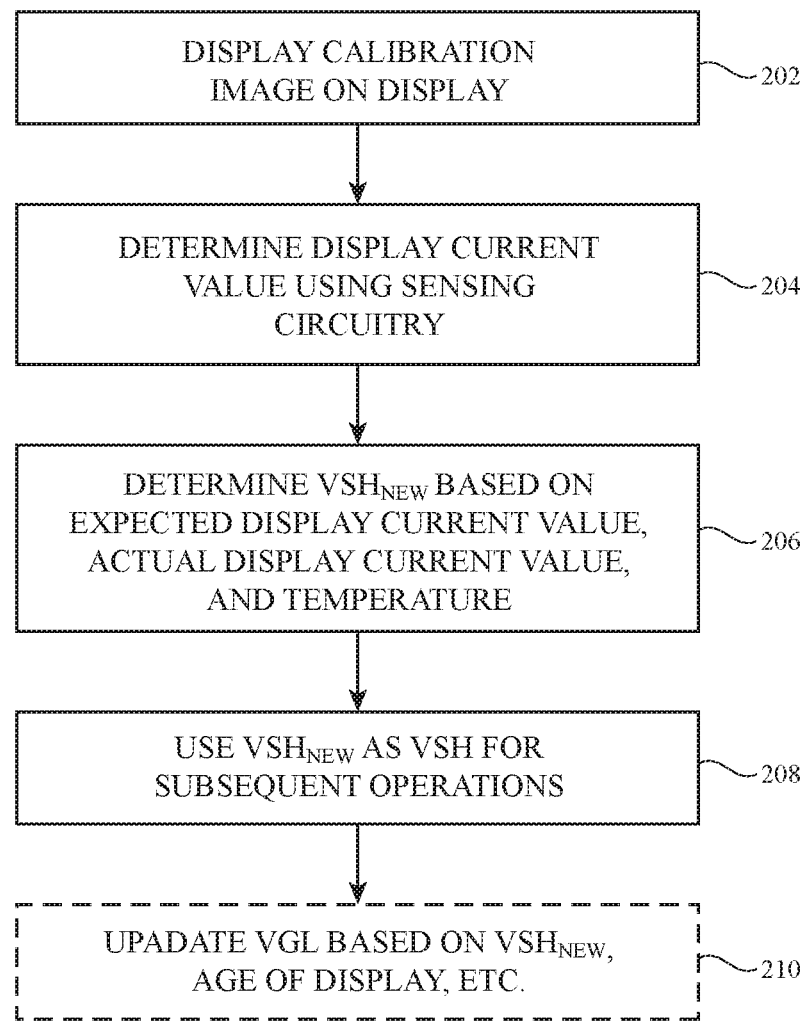
FIG. 12 is a flowchart of an illustrative method of compensating the high voltage level of the scan control signal of a semiconducting oxide transistor based on a measured display current and using a lookup table in accordance with an embodiment.

FIG. 12 is a flowchart of illustrative method steps that may be used to operate a display with sensing circuitry for dynamic VSH compensation (e.g., the display of FIG. 11). As shown in FIG. 12, at step 202 a calibration image may be displayed on the display. The calibration image may be any image for which the expected display current is known (due to testing of the display before the display operates in the field). The calibration image must be displayed any time VSH updating is performed so that there is a known standard with which to compare the actual display current.

It may be desirable for the calibration to be undetectable to the user of the electronic device. Therefore, an image that is displayed during routine use of the display may be selected as the calibration image. For example, an image with a keypad for unlocking the electronic (sometimes referred to as a lock screen), an image of a logo for the electronic device, a startup screen that is displayed during startup of the electronic device, or an image of a battery charge status symbol (sometimes referred to as a battery charge status screen) may be selected as the calibration image. Consider the battery charge status symbol as one example. To operate an electronic device, the user may routinely charge the device, thus guaranteeing that the battery charge status screen is displayed on a regular basis. This provides regular opportunities for VSH compensation without being detectable to the user. If desired, calibration data may be obtained for more than one calibration image (e.g., a battery charge status screen and lock screen). This may increase the flexibility of times in which VSH compensation may be performed without detection by the user.

Another factor that may be taken into consideration when choosing the calibration image is the magnitude of the display current generated by that image. To ensure sufficiently accurate testing of the display current, it may be desirable for the display current to be above a given magnitude. Increasing the display brightness may increase the magnitude of the display current. Similarly, increasing the percentage of pixels within the array that are active may increase the magnitude of the display current. For example, if a calibration image primarily includes active pixels (e.g., a primarily white image), the requisite display brightness for VSH calibration may be lower than if the calibration image includes a low percentage of active pixels (e.g., a primarily black image). At step 202, the calibration image may be displayed at a brightness level that is sufficiently high to enable accurate current sensing.

Next, at step 204, the actual display current value may be determined using sensing circuitry (e.g., sensing circuitry 102 in FIGS. 10 and 11). The display current value may be determined by coupling the ground power voltage supply terminal ELVSS to a sensing resistor and sensing a corresponding voltage that is proportional to the display current. At step 206, the actual display current value may be used to determine a new VSH current value ($VSH_{NEW}$). For example, a lookup table (e.g., lookup table 114 in FIG. 11) or algorithm may be used to generate $VSH_{NEW}$ based on the actual display current value, expected display current value, temperature, etc. Finally, at step 208, $VSH_{NEW}$ may be used as VSH for subsequent display operations. In general, VSH may be adjusted between any desired voltage values. For example, VSH may be adjusted between 7 V and 11 V, between 7 V and 10.5 V, or between any other desired voltages.

Negative voltage level VGL of Scan1 may optionally be adjusted at step 210. In general, the lower the voltage of VGL, the faster T3 will shut off during operation of the display. However, a lower VGL may result in a bigger bias on the transistor, ultimately causing deterioration of pixel performance over time. If VGL is too high, however, T3 may not completely shut off when Scan1 is driven to VGL as desired. VGL may be updated in step 210 based on a number of factors such as VSH, the age of the display, etc. In one illustrative example, VGL may track VSH. This means that the difference between VGL and VSH may remain constant (even as VSH changes). For example, if VSH drops from 10.5 V to 9.5 V, VGL may have a corresponding drop from −5 V to −6 V. The difference between VGL and VSH may instead be allowed to change if desired (e.g., VGL may remain at −5 V even if VSH drops from 10.5 V to 9.5 V). In general, processing circuitry within the electronic device (e.g., processing circuitry 104 in FIG. 10) may update VGL to be any desired voltage.

The method shown in FIG. 12 may be intermittently repeated to ensure VSH continuously tracks Vth_ox drift. The VSH compensation process (e.g., the method of FIG. 12) may be performed once every day, once every week, once every month, more than once a day, more than once a week, less than once a day, etc. The VSH compensation process may be performed based on the elapsing of real-time (e.g., calendar days, calendar weeks, etc.) or may be performed based on the elapsing of time in which the display is on. In general, VSH compensation may be performed at any desired time with any desired frequency.

In the example of FIG. 12, an updated VSH value is generated based on the sensed current value. However, this example for updating VSH is merely illustrative. Instead of using calibration data to select an updated VSH value (e.g., based on the lookup table), VSH may be incrementally adjusted until the actual display current matches (or is within a given percentage of matching) the expected display current. A VSH compensation method of this type is shown in the flowchart of FIG. 13.

Figure 13:
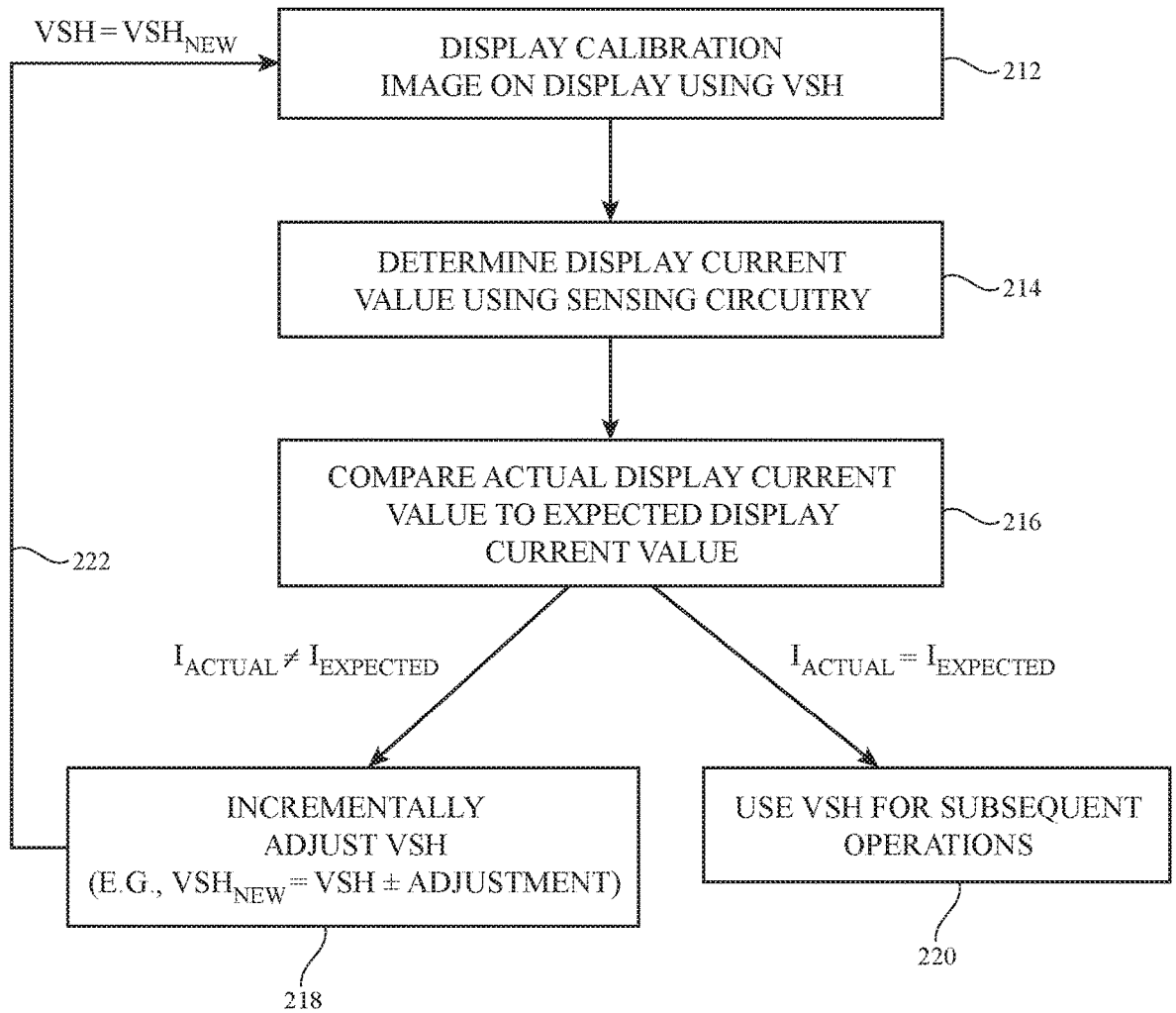
FIG. 13 is a flowchart of an illustrative method of compensating the high voltage level of the scan control signal of a semiconducting oxide transistor by incrementally changing the high voltage level in accordance with an embodiment.

As shown in FIG. 13, at step 212 a calibration image may be displayed on the display. As previously discussed, the calibration image may be any image for which the expected display current is known (e.g., a battery charge status screen). The calibration image may be displayed at a brightness level that is sufficiently high to enable accurate current sensing. A high scan voltage VSH may be used for scanning signal Scan1 when the image is displayed.

Next, at step 214, the actual display current value may be determined using sensing circuitry (e.g., sensing circuitry 102 in FIGS. 10 and 11). The display current value may be determined by coupling the ground power voltage supply terminal ELVSS to a sensing resistor and sensing a corresponding voltage that is proportional to the display current. At step 206, the actual display current value ($I_{ACTUAL}$) may be compared to the expected display current value ($I_{EXPECTED}$) associated with the calibration image. If the actual display current value does not match the expected display current value, the method may proceed to step 218.

At step 218, VSH may be incrementally adjusted by adding (or subtracting) a predetermined adjustment factor to VSH (e.g., $VSH_{NEW}=VSH+/-ADJUSTMENT$). The adjustment factor may be 10 mV, 10-50 mV, 30-70 mV, 50-100 mV, less than 1 mV, between 1 mV and 10 mV, less than 10 mV, less than 50 mV, less than 100 mV, less than 1V, greater than 10 mV, greater than 50 mV, greater than 100 mV, greater than 1 V, or other suitable adjustment factor. After adjusting VSH, the method may loop back to step 212 per feedback loop 222. Before step 212 occurs again, VSH is set to $VSH_{NEW}$ from step 218. The process may repeat as long as $I_{ACTUAL}$ does not equal $I_{EXPECTED}$. Once $I_{ACTUAL}$ equals $I_{EXPECTED}$, the method may proceed to step 220 where the VSH compensation is determined to be complete and normal display operations continue using VSH.

For example, at the beginning of the lifetime of the display, VSH may be equal to 10.5 V. If, during testing, it is determined that the $I_{ACTUAL}$ is not equal to $I_{EXPECTED}$, VSH may be reduced by 0.1 V to 10.4 V. The test will be repeated to obtain a new $I_{ACTUAL}$ value. The updated $I_{ACTUAL}$ will again be compared to $I_{EXPECTED}$. In this example, it is determined that the $I_{ACTUAL}$ is still not equal to $I_{EXPECTED}$. VSH may be reduced again by 0.1 V to 10.3 V. The test will be repeated to obtain a new $I_{ACTUAL}$ value. In this example, $I_{ACTUAL}$ now equals $I_{EXPECTED}$. Accordingly, the VSH compensation may be complete and the new value of VSH (10.3 V) may be used moving forward in operating the display.

It should be understood that the determination of whether $I_{ACTUAL}$ equals $I_{EXPECTED}$ may include a tolerance. For example, $I_{ACTUAL}$ may be deemed to equal (match) $I_{EXPECTED}$ if $I_{ACTUAL}$ is within 1% of $I_{EXPECTED}$, within 2% of $I_{EXPECTED}$, within 3% of $I_{EXPECTED}$, within 5% of $I_{EXPECTED}$, within 10% of $I_{EXPECTED}$, etc.

In the aforementioned examples, oxide transistor T3 is controlled by an active-high scan control signal (e.g., Scan1 is high when T3 is asserted and Scan1 is low when T3 is deasserted). However, this example is merely illustrative and is not intended to limit the scope of the present embodiments. One of ordinary skill can appreciate that T3 may instead be a p-channel thin-film transistor that is controlled by an active-low scan control signal (i.e., scan control signal Scan1 is driven low to turn on transistor T3 and driven high to turn off transistor T3). In this type of embodiment, the principles described above (of modifying VSH to track Vth_ox) may still be applied. However, instead of lowering VSH to compensate for Vth_ox decreasing, VGL may be raised when T3 is a p-channel thin-film transistor. The same techniques for adjusting VSH as described above may be applied to adjusting VGL when T3 is a p-channel thin-film transistor.

The foregoing is merely illustrative and various modifications can be made to the described embodiments. The foregoing embodiments may be implemented individually or in any combination.

What is claimed is:

1. A display, comprising:
an array of pixels, wherein each pixel in the array of pixels comprises a light-emitting diode, a drive transistor, and a switching transistor;
gate driver circuitry configured to provide a control signal to the switching transistor at a first voltage level to turn on the switching transistor;
a ground power supply voltage trace, wherein the light-emitting diode of each pixel in the array of pixels is coupled to the ground power supply voltage trace;
sensing circuitry coupled to the ground power supply voltage trace, wherein the sensing circuitry is configured to measure a single display current that is associated with the entire array of pixels; and
processing circuitry configured to change the first voltage level for the entire array of pixels based on the single display current, wherein changing the first voltage level for the entire array of pixels based on the single display current comprises lowering the first voltage level in response to determining that the single display current is less than an expected display current value.

2. The display defined in claim 1, wherein the switching transistor has a channel formed in semiconducting oxide.

3. The display defined in claim 2, wherein the drive transistor has a channel formed in silicon.

4. The display defined in claim 1, wherein the light-emitting diode of each pixel is coupled between a first power supply terminal and a second power supply terminal.

5. The display defined in claim 4, wherein the sensing circuitry comprises a current sensing resistor coupled to the second power supply terminal and an analog-to-digital converter coupled to the current sensing resistor.

6. The display defined in claim 5, wherein the sensing circuitry comprises an amplifier interposed between the current sensing resistor and analog-to-digital converter.

7. The display defined in claim 5, wherein an output terminal of the analog-to-digital converter is coupled to the processing circuitry.

8. The display defined in claim 7, wherein the processing circuitry is configured to incrementally change the first voltage level until the measured single display current matches the expected display current value.

9. The display defined in claim 8, wherein the gate driver circuitry is configured to provide the control signal to the switching transistor at a second voltage level to turn off the switching transistor and wherein the processing circuitry is configured to change the second voltage level.

10. The display defined in claim 7, wherein the processing circuitry is configured to use a lookup table to determine an updated first voltage level based at least on the measured single display current and a temperature.

11. A display, comprising:
an array of pixels, wherein each pixel in the array of pixels comprises a light-emitting diode, a drive transistor, and a switching transistor;
gate driver circuitry configured to provide a control signal to the switching transistor at a first voltage level to turn on the switching transistor;
a ground power supply voltage trace, wherein the light-emitting diode of each pixel in the array of pixels is coupled to the ground power supply voltage trace;
sensing circuitry coupled to the ground power supply voltage trace, wherein the sensing circuitry is configured to measure a single display current that is associated with the entire array of pixels; and
processing circuitry configured to change the first voltage level for the entire array of pixels based on the single display current, wherein the light-emitting diode of each pixel is coupled between a first power supply terminal and a second power supply terminal, wherein the sensing circuitry comprises a current sensing resistor coupled to the second power supply terminal and an analog-to-digital converter coupled to the current sensing resistor, wherein an output terminal of the analog-to-digital converter is coupled to the processing circuitry, wherein the processing circuitry is configured to change the first voltage level based on a comparison between the measured single display current and an expected current, wherein the processing circuitry is configured to incrementally change the first voltage level until the measured single display current matches the expected current, wherein the gate driver circuitry is configured to provide the control signal to the switching transistor at a second voltage level to turn off the switching transistor, wherein the processing circuitry is configured to change the second voltage level, and wherein the processing circuitry is configured to lower the first voltage level by a first amount and the second voltage level by the first amount in response to determining that the measured single display current is less than the expected current.

12. A method of operating a display with an array of pixels, sensing circuitry coupled to a ground power supply voltage trace that is coupled to each pixel in the array of pixels, and processing circuitry coupled to the sensing circuitry, wherein each pixel in the array of pixels includes a light-emitting diode, a drive transistor connected in series with the light-emitting diode, and a switching transistor that has a gate terminal that receives a scan control signal that is provided to the array of pixels, the switching transistor is coupled between a gate terminal of the drive transistor and one of a source terminal and a drain terminal of the drive transistor, and the other one of the source terminal and the drain terminal of the drive transistor is coupled to the light-emitting diode, the method comprising:

displaying an image using the array of pixels;

while displaying the image using the array of pixels, using the sensing circuitry to measure a display current value; and based at least on the display current value and an expected display current value, updating an active voltage level of the scan control signal, wherein updating the active voltage level of the scan control signal comprises lowering the active voltage level of the scan control signal in response to determining that the display current value is less than the expected display current value.

13. The method defined in claim 12, wherein the switching transistor has a channel formed in semiconducting oxide.

14. The method defined in claim 12, wherein updating the active voltage level of the scan control signal comprises using a lookup table to determine an updated active voltage level based at least on the display current value, the expected display current value, and a temperature.

15. The method defined in claim 12, wherein updating the active voltage level of the scan control signal comprises repeatedly displaying the image using the active voltage level of the scan control signal, using the sensing circuitry to obtain the display current value, and incrementally adjusting the active voltage level of the scan control signal until the display current value matches the expected display current value.

16. The method defined in claim 12, wherein displaying the image using the array of pixels comprises displaying a battery charge status screen using the array of pixels.

* * * * *